United States Patent
Manetakis

(10) Patent No.: US 7,012,465 B2
(45) Date of Patent: Mar. 14, 2006

(54) LOW-VOLTAGE CLASS-AB OUTPUT STAGE AMPLIFIER

(75) Inventor: Konstantinos Manetakis, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 479 days.

(21) Appl. No.: 09/943,888

(22) Filed: Aug. 30, 2001

(65) Prior Publication Data

US 2003/0042981 A1    Mar. 6, 2003

Related U.S. Application Data

(60) Provisional application No. 60/310,747, filed on Aug. 7, 2001.

(51) Int. Cl.
   *H03F 3/45* (2006.01)
(52) U.S. Cl. .................................... 330/253; 330/255
(58) Field of Classification Search ............... 330/253, 330/255, 260, 261
   See application file for complete search history.

(56) References Cited

U.S. PATENT DOCUMENTS 5,223,753 A * 6/1993 Lee et al. ..................... 327/65
5,486,790 A * 1/1996 Huijsing et al. ............ 330/260

(Continued)

FOREIGN PATENT DOCUMENTS

| EP | 0309063 | 9/1988 |
| EP | 0475507 | 9/1991 |
| EP | 0797295 | 9/1997 |

OTHER PUBLICATIONS

Eric Vittoz, "Analog VLSI Signal Processing: Why, Where and How?", Journal of VLSI Signal Processing, vol. 8, pps 27-44 and Analog Integrated Circuits and Signal Processing, pps 27-44, Jul. 1994.

(Continued)

*Primary Examiner*—Ling Van Nguyen
(74) *Attorney, Agent, or Firm*—Philip Wadsworth; Bruce W. Greenhaus; Donald C. Kordich

(57) ABSTRACT

A programmable, rail-to-rail, low-voltage, micro-power harmonic-mean class-AB output stage with MOS devices employed in weak inversion is provided. The output stage MOS devices are arranged in the translinear loop, which avoids having a plurality of MOS devices in series between the power supply rails and thus enables low-voltage operation. The MOS devices in the translinear loop are used to implement the harmonic mean function $x*y=z*(x+y)$ where x and y are mirrored to the output and represent the quiescent push and pull currents, respectively. Circuit operational parameters may be varied to suit a variety of different applications. Increasing the supply voltage for given quiescent current will advantageously increase the maximum current load. Increasing the quiescent current for given supply voltage will advantageously lower the distortion of the output stage.

29 Claims, 3 Drawing Sheets

U.S. PATENT DOCUMENTS

| | | | |
|---|---|---|---|
| 5,561,396 A * | 10/1996 | Hogervorst et al. | 330/253 |
| 5,631,607 A * | 5/1997 | Huijsing et al. | 330/253 |
| 5,734,297 A * | 3/1998 | Huijsing et al. | 330/253 |
| 5,825,246 A * | 10/1998 | Koifman et al. | 330/255 |
| 5,856,749 A * | 1/1999 | Wu | 327/66 |
| 5,880,627 A * | 3/1999 | Thiel, V | 327/562 |
| 6,002,276 A * | 12/1999 | Wu | 327/66 |
| 6,259,322 B1 * | 7/2001 | Muza | 330/257 |
| 6,414,552 B1 * | 7/2002 | Kronmueller et al. | 330/288 |
| 6,437,612 B1 * | 8/2002 | Dasgupta et al. | 327/108 |
| 6,556,081 B1 * | 4/2003 | Muza | 330/253 |

OTHER PUBLICATIONS

Yan, et al., "Low Voltage Analog Circuit Design Techniques: A Tutorial", IEICE Trans. Analog Integrated Circuits and Systems, vol E00-A, No. 2, Feb. 2000.

\* cited by examiner

LOW-VOLTAGE CLASS-AB OUTPUT STAGE AMPLIFIER

RELATED APPLICATIONS

This application claims priority to U.S. Provisional Application No. 60/310,747, filed Aug. 7, 2001, having the same title "LOW-VOLTAGE CLASS-AB OUTPUT STAGE AMPLIFIER" and the same inventor.

FIELD OF THE INVENTION

The present invention relates to electronic amplifiers and, in particular, to class-AB amplifiers.

BACKGROUND OF THE INVENTION

The output stage of class-AB amplifiers operates by using a current source and a current sink. This configuration is sometimes referred to as a "push-pull" configuration since a first branch of the output stage "pushes" or sources currents to a load while a second branch of the output stage "pulls" or sinks current from the load. Class-AB amplifiers avoid the high power consumption of a class-A amplifier by always having one output branch substantially turn off when the other output branch is turned on. Although the current in one leg of a class AB amplifier is substantially turned off there is a small amount of current flowing in that leg. The small residual current in the class AB amplifier avoids the crossover distortion produced the turning on and off of the currents in class-B amplifiers. Thus class-AB amplifiers are able to achieve a relatively high current output while maintaining a low quiescent current. The currents in class-AB amplifiers are inversely related such that when one current becomes large, the other current becomes very small. When a current becomes small, it may disadvantageously result in a "cut-off" in one of the output transistors, which causes the undesirable crossover distortion.

This problem has been addressed in amplifiers by using the harmonic mean principle that is described by the equation $z=x*y/(x+y)$, where x and y represent push and pull currents, respectively, and z represents a bias current. From this relationship it can be seen that as a push current becomes larger (represented by x here, for example), the accompanying pull current will become smaller, but will not result in a "cut-off" of the transistor carrying the pull current because the pull current can never become smaller than the bias current. Likewise, a large pull current will be accompanied by a small push current, which also can never become smaller than the bias current.

Bipolar devices have been used to implement the harmonic mean principle in class-AB output stages. However, the relatively limited beta available from bipolar transistors disadvantageously restricts the suitability of a bipolar implementation for applications requiring a large push/pull current to quiescent current ratio. Proposed topologies, for MOS devices such as those discussed in Hogervost, R. et al., "A compact Power-Efficient 3V CMOS Rail-to-Rail Input/Output Operational Amplifier for VLSI Cell Libraries," IEEE JSSC 29(12):1718 (December 1994), are unsuitable for applications requiring a low supply voltage because they require a supply voltage of at least $2*V_{GS}+V_{DS}^{sat}$.

Therefore it can be seen that there remains a need for the high gain class-AB output stage that is able to operate using a low-voltage power supply. The present invention provides this and other advantages as will be apparent from the following detailed description and accompanying figures.

SUMMARY OF THE INVENTION

The limitations of prior circuits having output stages are overcome by the present invention, which is a circuit having a class-AB output stage. In an exemplary embodiment, a plurality of MOS transistor devices are configured in a translinear loop to generate first and second control currents having a harmonic mean relationship. A first output circuit is coupled to a first voltage supply and an output node so that the first output circuit sources a first output current based on the first control current. A second output circuit is coupled to a second voltage supply and an output node so that the second output circuit sources a second output current based on the second control current.

In one embodiment of the invention, the first and second output circuits are current mirrors so that the first and second output currents are equal to the first and second control currents, respectively.

In another embodiment of the invention, the MOS transistor devices are NMOS devices that operate in weak inversion mode.

In another embodiment, the bias current may be increased above a selected predetermined level to lower a distortion level of the circuit.

In yet another embodiment, the supply voltage may be increased above a selected predetermined level to increase a current drive capacity of the circuit.

DETAILED DESCRIPTION OF THE PREFERRED EMBODIMENTS

Figure 1:
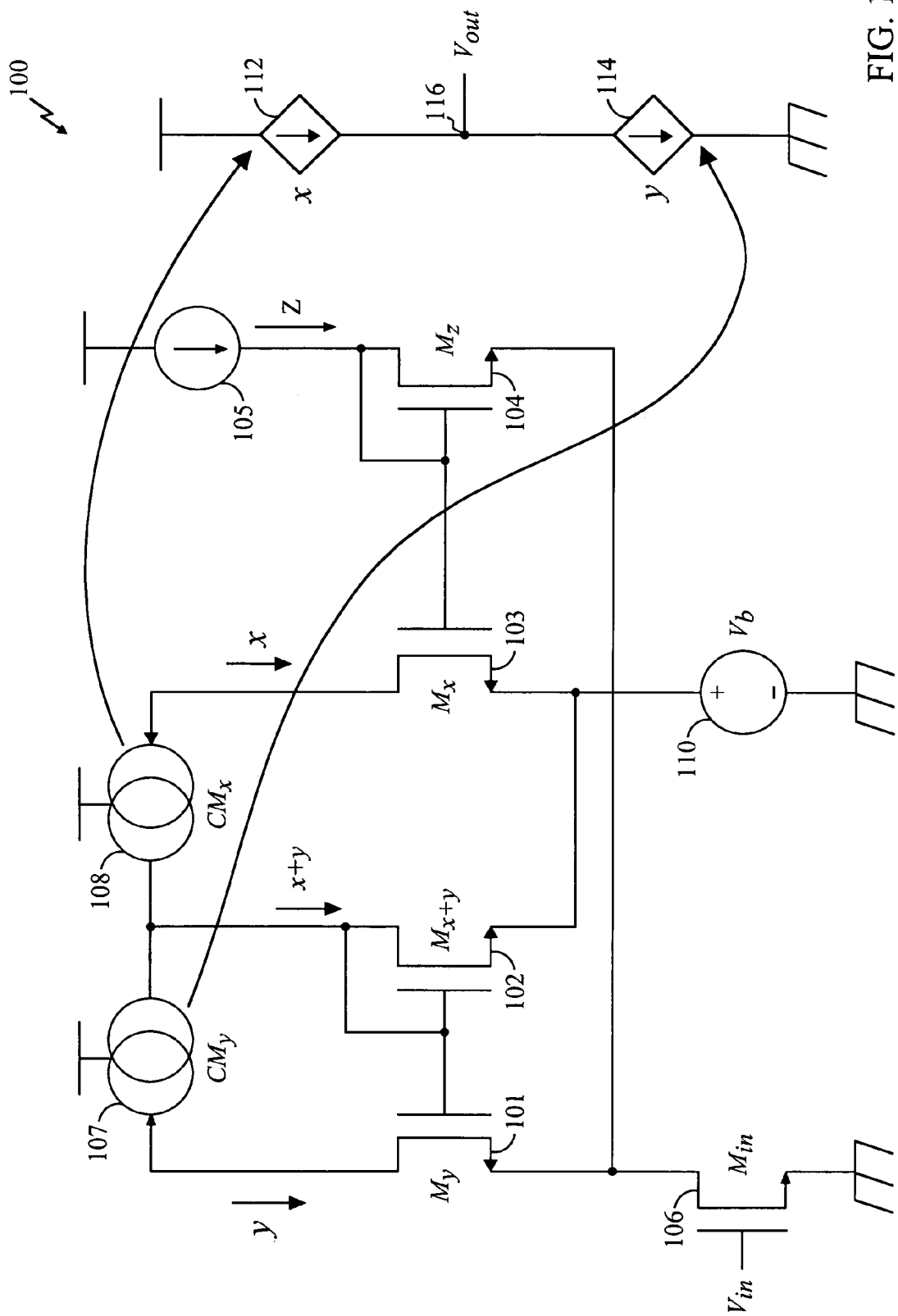
FIG. 1 is a schematic diagram of a harmonic mean class-AB output stage.

The present invention is directed to a circuit architecture that implements a harmonic mean class-AB output stage that maintains a desirable quiescent current, is able to produce an output voltage with a wide voltage swing and is capable of operating at low power supply voltages. FIG. 1 is a schematic diagram of a harmonic mean class-AB output stage designed in accordance with the principles of the present invention. An output stage 100 employs MOS devices in weak inversion to achieve push/pull-current-to-quiescent-current ratios of more than 200 while retaining the ability to operate using a low-voltage power supply.

The operation of MOS devices in weak inversion occurs in a MOS device when the gate-to-source voltage is just slightly less than the threshold voltage. Threshold in a MOS device is defined as the voltage at which a channel is formed under the gate. With operation in weak inversion no channel is formed. Operation in weak inversion allows the MOS device to operate in the region wherein the drain current increases exponentially as a function of the gate voltage. The circuit architecture of the present invention utilizes MOS devices operating in weak inversion and configured in a translinear loop. The use of transistors in a translinear loop configuration is well known in the art. The operational characteristics of the translinear loop configuration need not be described in detail herein.

The present invention implements the product terms x*y and z*(x+y) of the harmonic mean function by employing MOS devices 101–104 in a low-voltage translinear loop that is biased by a current source 105. As will be discussed in greater detail below, the bias current z can be altered to tailor the circuit response for specific applications. The current source 105, which generates the bias current z, may be generated using conventional transistor circuits. Alternatively, if the output stage 100 is part of an integrated circuit, the current source 105 may simply be a resistor coupled to a power supply. In this embodiment, the current source 105 would be external to the integrated circuit to permit user selection of the resistor value and thus the bias current. The present invention is not limited by the specific implementation of the current source 105. The various currents of the mean harmonic function are generated by various ones of the individual MOS devices. Specifically, the MOS device 101 comprises a drain coupled to a current mirror 107 from which a current y is supplied. Likewise, the MOS device 103 comprises a drain coupled to a current mirror 108 from which a current x is supplied. The gate of the MOS device 101 is coupled to both the current mirror 107 and the current mirror 108, which commonly supply the current x+y to the gate of the MOS device 101 and the gate and the drain of the MOS device 102. The source of the MOS device 101 and the source of the MOS device 104 are coupled to the drain of a MOS device 106, which allows the output stage 100 to be modulated according to an input voltage $V_{in}$ applied to the gate of the MOS device 106. A bias voltage 110 is applied to the sources of the MOS devices 102–103, which sink the currents x+y and x, respectively. A bias current z is generated by a current source 105 and applied to the gate of the MOS device 103 and the drain and the gate of the MOS device 104.

Low-voltage operation of the output stage 100 is achieved by configuring the translinear loop so that no MOS devices are placed in series across a power supply within the translinear loop. The invention is operable with supply voltages as low as $V_{GS}+2*V_{DS}^{sat}$ where $V_{GS}$ is the gate-to-source voltage, and $V_{DS}$ is the drain-to-source voltage at saturation. This minimum voltage is required by the MOS device 101 that carries current y, and the MOS device 106, which modulates the translinear loop according to an input voltage applied to the gate of the MOS device 106.

Using Kirchhoff's voltage law, the gate-to-source voltages in the translinear loop may be represented by the expression $V_{GS}$ 101–$V_{GS}$ 102+$V_{GS}$ 103–$V_{GS}$ 104 where the MOS device 101 has gate-to-source voltage $V_{GS}$ 101, the MOS device 102 has gate-to-source voltage $V_{GS}$ 102, the MOS device 103 has gate-to-source voltage $V_{GS}$ 103, and the MOS device 104 has gate-to-source voltage $V_{GS}$ 104. Simplifying, the expression becomes $V_{GS}$ 101+$V_{GS}$ 103=$V_{GS}$ 102+$V_{GS}$ 104, where the MOS device 101 carries the current y, $V_{GS}$ 103 carries the current x, the MOS device 102 carries the current x+y, and the MOS device 104 carries current z. Thus, each of the MOS devices 101–104 carries one component of the currents from the harmonic mean equation discussed above. Because the currents are an exponential function of the gate voltages, as discussed above, the currents may be expressed as product terms of the harmonic mean: x*y=z*(x+y). It should be noted that maintaining the balance of currents using harmonic mean is important for operation with quiescent currents. That is, it is desirable to maintain the harmonic mean relationship when no signal is present at the input ($V_{in}$). When a signal is present and significant current is flowing through the output stage 100, the harmonic mean relationship of the currents need not be maintained.

The currents x and y are mirrored to the output as shown by the arrows in FIG. 1 to obtain an output voltage $V_{out}$ with a rail-to-rail swing. The desired push/pull currents are generated by output MOS devices 112 and 114, respectively. As illustrated in FIG. 1, the output MOS device 112 generates a current x while the output MOS device 114 generates the output current y. The output voltage $V_{out}$ is taken from an output node 116 between the two MOS output devices 112 and 114. The maximum achievable push/pull current is limited by the MOS output devices 112 and 114 entering the linear region of operation. The push/pull current can be increased by increasing the aspect ratios (i.e. the width-to-length ratio of the channel) of the MOS output devices 112 and 114. The maximum achievable output voltage is determined by the supply voltage and by the saturation voltage of the MOS output devices 112 and 114.

Circuit operational parameters may be varied to suit a variety of different applications. For example, increasing the supply voltage for a given quiescent current will advantageously increase the maximum current load. The increased voltage provides higher push/pull current-to-quiescent-current ratios, but results in higher power consumption. In this example, the circuit operational parameters have been varied to increase the maximum current load. This configuration may be advantageously used for power applications.

Reciprocally, increasing the quiescent current for a given supply voltage will advantageously improve the gain-bandwidth product and crossover distortion performance of the circuit. As those skilled in the art can appreciate, MOS transistors have an inherent capacitance associated with the gate. If the quiescent current is too low, the gate capacitance limits the frequency response. Thus, by increasing the quiescent current for audio applications, the effects of the inherent gate capacitance are minimized and the frequency response and crossover distortion performance of the output stage 100 are improved. The increased quiescent current provides better frequency and crossover distortion performance, but results in lower push/pull current to quiescent current ratios. In this example, the circuit operational parameters have been altered to improve the signal response characteristics of the output stage 100. This configuration may be used to advantageously increase the fidelity of the amplification of the output stage 100 for applications, such as audio circuits.

The circuit of FIG. 1 has been simulated using the process parameters of the modern 0.35-micron CMOS technology using a value of 200 nA for current z, a supply voltage of 1.8V, and a quiescent current of 2.4 μA to achieve a load current-to-quiescent-current ratio of over 200.

Figure 2:
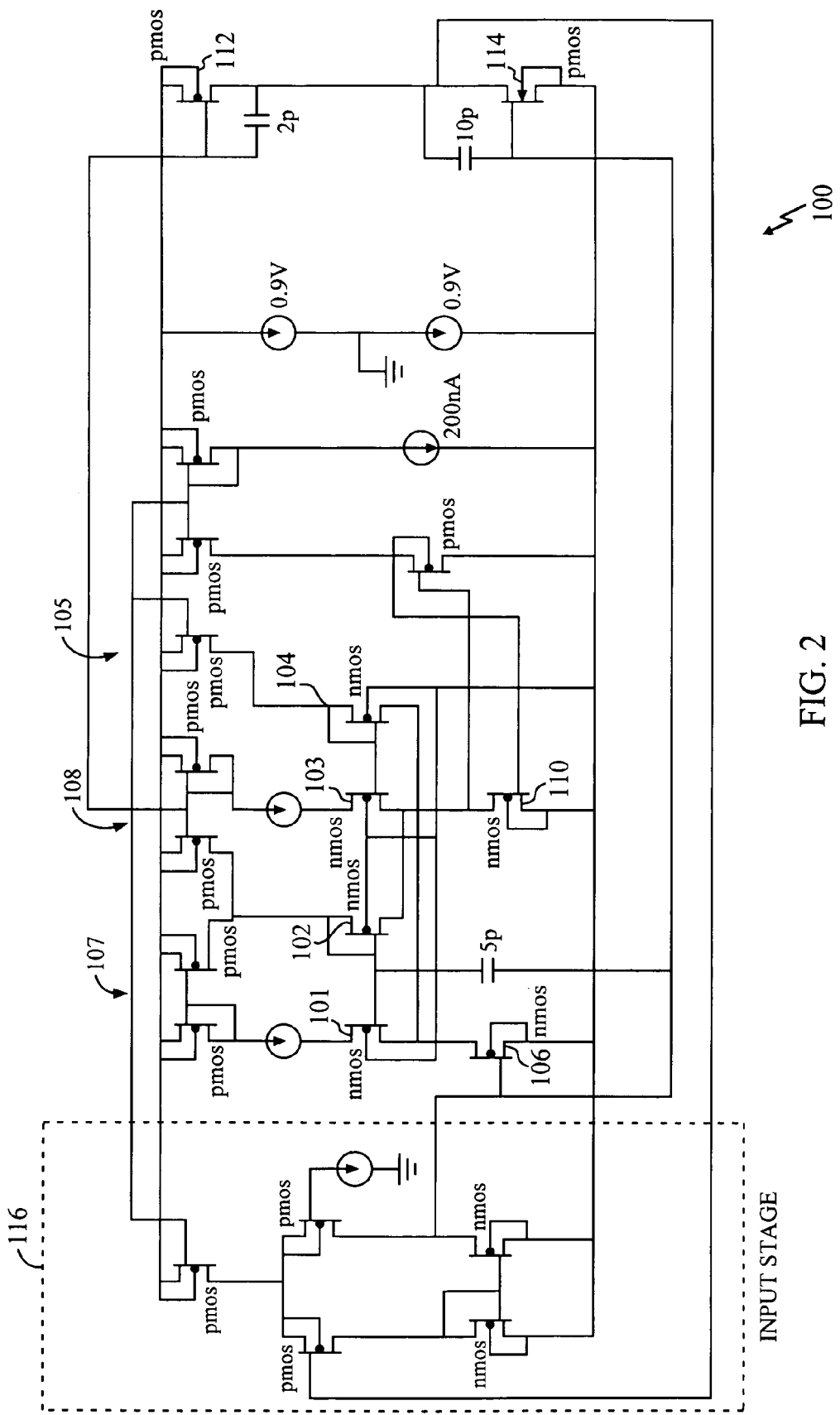
FIG. 2 is schematic diagram of an operational amplifier utilizing the output stage of FIG. 1.

FIG. 2 is an example schematic diagram of the harmonic mean class-AB output stage 100 combined with a conventional differential input stage 116 to form an operational amplifier. It should be understood that the differential input stage 116 in FIG. 2 is intended to simply illustrate the operation of the output stage 100 in an operational environment. However, the present invention is directed to the output stage 100 and is not limited by the specific configuration of an input stage.

The current mirrors 107 and 108 are implemented in the circuit of FIG. 2 by respective pairs of PMOS devices. The minimum operational voltage requirement of the output stage 110 is determined by the input MOS device 106, the MOS device 101, and the transistors in the current source 107. In the implementation illustration in FIG. 2, the minimum voltage required to operate the output stage 110 is determined b the gate-to-source voltage ($V_{GS}$) of the MOS device 106 and the saturation voltages ($V_{DS}^{sat}$) of the MOS device 101 and the MOS device M8, which is part of the current mirror 107. Thus, the minimum voltage required for satisfactory operation of the output stage 100 is $V_{GS}$+ $2*V_{DS}^{sat}$.

In the circuit implementation of FIG. 2, the current source 105 is implemented by a MOS device M11. However, as previously noted, the current source 105 may be implemented by a resistor, such as an external user-selected resistor coupled to a power supply to generate the desired bias current.

The power supply illustrated in the circuit implementation of FIG. 2 is a bipolar supply generated by the voltage sources V4 and V5, each of which generates a 0.9 V level. Thus, the supply voltage of 1.8 V is generated in the form of a ±0.9 V supplies. The output MOS devices 112 and 114 are implemented in the circuit of FIG. 2 as a PMOS and NMOS device, respectively. As previously noted, the maximum output voltage of the output stage 100 is determined by the power supply and by the saturation voltages of the output devices 112 and 114. It is desirable to maintain the MOS output devices 112 and 114 in nonlinear operation. This constraint may be met by limiting the maximum output current generated by the MOS output devices 112 and 114. Alternatively, as discussed above, the geometry of the MOS output devices 112 and 114 may be altered.

A SPICE simulation of the circuit of FIG. 2 having a current z of 200 nA and a supply voltage of 1.8V resulted in a quiescent current of 3.5 µA (including the differential input stage), and an output voltage swing of 1.2V across a 2KΩ load (with a ±300 µA load current). The simulation also resulted in a gain-bandwidth product of 150 kHz. A 4 pF Miller capacitor is used to compensate the operational amplifier.

As discussed above with respect to FIG. 1, the maximum current on a load can be increased by increasing supply voltage, while maintaining the same quiescent current, and the quiescent current can be increased to lower distortion of the circuit. The quiescent current can be varied by merely varying current source z without having to modify the rest of the circuit. Thus, the performance of the harmonic mean class-AB output stage amplifier embodied as an operational amplifier may be tailored to specific applications by varying the bias current z and/or the supply voltage only.

Figure 3:
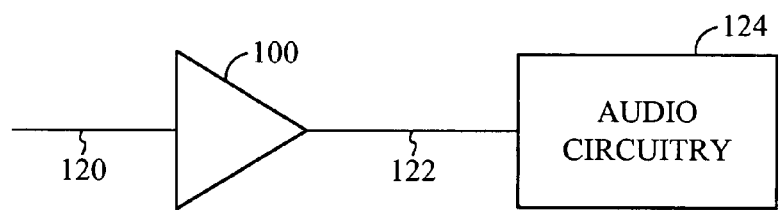
FIG. 3 is a schematic diagram of the output stage of FIG. 1 used to amplify an audio signal.
Figure 4:
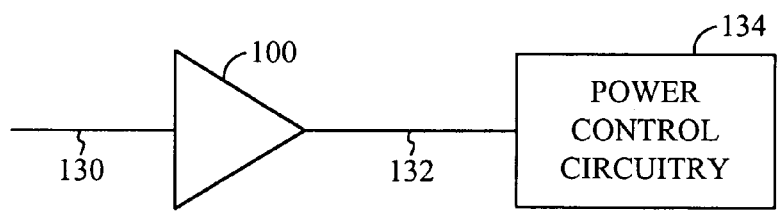
FIG. 4 is a schematic diagram of the output stage of FIG. 1 used to amplify a power control signal.

FIGS. 3 and 4 illustrate the different applications for the inventive output stage 100. FIG. 3 is a schematic diagram of the harmonic mean class-AB output stage 100 used to amplify an audio signal. For the sake of clarity, the output stage 100 is simply illustrated in block form in FIGS. 3 and 4. With reference to FIG. 3, an audio input signal 120 is provided to the output stage 100. The input signal 120 may be derived, by way of example, from the differential input stage 116 illustrated in FIG. 2. Regardless of the source of the signal, the input signal 120 is provided to the output stage 100. The input signal 120 may be applied as an input voltage $V_{in}$ applied to the MOS device 106 (see FIG. 1). The output stage 100 generates an audio output signal 122. The output signal 122 may be in the form of a voltage, such as $V_{out}$ in the circuit of FIG. 1. The output signal 122 is coupled to audio circuitry 124. The audio circuitry 124 may comprise an output transducer, such as a speaker, or other additional electronic circuitry, such as an audio preamplifier, mixer, power amplifier, sound-effect circuitry, and the like. These devices are all well known in the art and need not be described in greater detail herein. As noted, the present invention is directed to the inventive output stage 100, which may be coupled to many different forms of audio circuitry 124.

Typical audio applications require low distortion as a primary consideration and high gain as a secondary consideration. By increasing the quiescent current above a selected predetermined level, the gain of the output stage 100 is reduced, but the output signal 122 of the output stage 100 is more faithful to the original input signal 120 and thus is presumably more pleasing to the ear of a listener.

FIG. 4 is a schematic diagram of the harmonic mean class-AB output stage 100 used to amplify a power control signal. Again, the output stage 100 is illustrated in block form in FIG. 4. A power control input signal 130 is provided to the output stage 100. As noted above with respect to FIG. 3, the signal provided to the output stage 100 may come from any known circuit. One example of a circuit is illustrated in the schematic of FIG. 2, where the differential input stage 116 provides the power control input signal 130. The power control input signal 130 may take the form of a voltage, such as $V_{in}$ applied to the MOS device 106 (see FIG. 1). The output stage 100 generates a power control output signal 132. In an example embodiment, the power control output signal 132 may be in the form of a voltage, such as $V_{out}$ in the circuit of FIG. 1. The power control output signal 132 is coupled to power control circuitry 134. The power control circuitry 134 may include, by way of example, pass transistors in a power supply, power transistors in a servomotor, stepper motor, or the like. The operation of such devices is well known in the art and need not be described in any detail herein. As noted above, the present invention is directed to the output stage 100 and is not limited by the specific form of any power control circuitry 134.

Typical power control applications require high output current as a primary consideration and low distortion as a secondary consideration. Lower frequency response and minimal distortion is not generally a major concern in power applications. However, maintaining a low quiescent current and having a high maximum current to quiescent current ration is desirable. Thus, the user may alter the quiescent current z in the manner described above to minimize the quiescent current for power control applications. By increasing the supply voltage, the output stage 100 generates an increased output current and thus the power control output signal 132 is suitable for a greater number of power control applications.

Thus, the inventive output stage 100 may be easily altered for a variety of different electrical circuit applications. The translinear loop configuration allows low-voltage operation while the use of MOS devices permits a high output current-to-quiescent current ratio.

It is to be understood that even though various embodiments and advantages of the present invention have been set forth in the foregoing description, the above disclosure is illustrative only, changes may be made in detail, yet remain within the broad principles of the invention. Therefore, the present invention is to be limited only by the appended claims.

What is claimed is:

1. A circuit having a class-AB output stage, comprising: first, second, third, and fourth MOS transistor devices configured in a translinear loop including semiconductor junctions of the first, second, third, and fourth MOS transistor devices connected in series, semiconductor junctions of a first pair of the first, second, third, and fourth MOS transistor devices connected in a clockwise direction, and semiconductor junctions of a second different pair of the first, second, third, and fourth MOS transistor devices connected in a counter-clockwise direction, the first MOS transistor device carrying a first control current, the second MOS transistor device carrying a second control current, the third MOS transistor device carrying a current equal to the sum of the first and second control currents, and the fourth MOS transistor device carrying a bias current;

a first output circuit coupled to a first voltage supply and an output node, the first output circuit sourcing a first output current based on the first control current; and a second output circuit coupled to a second voltage supply and the output node, the second output circuit sourcing a second output current based on the second control currents.

2. The circuit of claim 1 wherein the first and second output circuits are current mirrors and the first and second output currents equal the first and second control currents, respectively.

3. The circuit of claim 1 wherein the MOS transistor devices are NMOS devices.

4. The circuit of claim 1 wherein the MOS transistor devices operate in weak inversion mode.

5. The circuit of claim 1, further comprising a supply voltage having a voltage lower than 2*VGS+VDSsat to provide the first voltage supply.

6. The circuit of claim 1, further comprising a supply voltage having a voltage equal to VGS+2* VDSsat to provide the first voltage supply.

7. The circuit of claim 1 wherein the bias current is programmable to permit user selection of a bias current.

8. The circuit of claim 1 wherein a quiescent current of the output stage is set by the bias control current, the bias current being increased above a selected predetermined level to lower a distortion level of the circuit.

9. The circuit of claim 8, farther comprising an audio circuit wherein the output node is coupled to the audio circuit.

10. The circuit of claim 1, further comprising:
a gate of the first MOS transistor device coupled to a gate of the third MOS transistor device to connect gate—source semiconductor junctions of the first and the third MOS transistor devices in series; and
a gate of the second MOS transistor device coupled to a gate of the fourth MOS transistor device to connect gate—source semiconductor junctions of the second and the fourth MOS transistor devices in series.

11. The circuit of claim 10, further comprising:
a source of the first MOS transistor device coupled to a source of the fourth MOS transistor device to connect gate—source semiconductor junctions of the first and the fourth MOS transistor devices in series, and
a source of the second MOS transistor device coupled to a source of the third MOS transistor device to connect gate—source semiconductor junctions of the second and the third MOS transistor devices in series.

12. The circuit of claim 11, further comprising:
a drain of the third MOS transistor device coupled to the gate of the third MOS transistor device and the gate of the first MOS transistor device; and
a drain of the fourth MOS transistor device coupled to the gate of the fourth MOS transistor device and the gate of the second MOS transistor device.

13. The circuit of claim 12, further comprising:
a fifth MOS transistor device having a drain coupled to the source of the first MOS transistor device and the source of the fourth MOS transistor device to permit the circuit to be modulated according to an input voltage applied to a gate of the fifth MOS transistor device; and a bias voltage applied to the source of the second MOS transistor device and the source of the third MOS transistor device to provide a sink for the second control current carried by the second MOS transistor device and for the sum of the first and second control currents carried by the third MOS transistor device.

14. A circuit having a class-AB output stage, comprising:
a plurality of MOS transistor devices configured in a translinear loop to generate first and second control currents having a harmonic mean relationship, the translinear loop including an even number of semiconductor junctions of the plurality of MOS transistor devices connected in series, semiconductor junctions of a first even number of the plurality of MOS transistor devices connected in a clockwise direction, and semiconductor junctions of a second different even number of the plurality of MOS transistor devices connected in a counter-clockwise direction;

a first output circuit coupled to a first voltage supply and an output node, the first output circuit sourcing a first output current based on the first control current; and a second output circuit coupled to a second voltage supply and the output node, the second output circuit sourcing a second output current based on the second control currents wherein the plurality of MOS transistor devices comprise first, second, third and fourth MOS transistor devices, wherein the first MOS transistor device is coupled the first control current, the second MOS transistor device is coupled to a current that equals in the sum of the first and second control currents, the third MOS transistor device is coupled to the second control current, and a fourth MOS transistor device is coupled to a bias control current.

15. The circuit of claim 14 wherein the first and second output circuits are current mirrors and the first and second output currents equal the first and second control currents, respectively.

16. The circuit of claim 14 wherein the MOS transistor devices are NMOS devices.

17. The circuit of claim 14 wherein the MOS transistor devices operate in weak inversion mode.

18. The circuit of claim 14, further comprising a supply voltage having a voltage lower than 2*VGS+VDSsat to provide the first voltage supply.

19. The circuit of claim 14, further comprising a supply voltage having a voltage equal to VGS+2*VDSsat to provide the first voltage supply.

20. The circuit of claim 14 wherein the first voltage supply is 1.8 volts and the second voltage supply is a ground reference.

21. The circuit of claim 14 wherein the first and second output circuits comprise first and second output MOS transistor devices, respectively, the maximum output voltage range at the output node being substantially equal to the difference between the first and second voltage supplies minus a saturation voltage of the first and second MOS output transistor devices.

22. The circuit of claim 14 wherein the sources of the second and third and MOS transistor devices are coupled to a bias voltage.

23. The circuit of claim 14 wherein a quiescent current of the output stage is set by a bias control current.

24. The circuit of claim 23, further comprising an audio circuit wherein the bias current is increased above a selected predetermined level to lower a distortion level of the circuit for use with the audio circuit.

25. The circuit of claim 23, further comprising a power control circuit wherein the output node is coupled to the power control circuit.

26. The circuit of claim 14, wherein the plurality of MOS transistor devices comprise first, second, third and fourth MOS transistor devices, the circuit further comprising;
a gate of the first MOS transistor device coupled to a gate of the third MOS transistor device to connect gate—source semiconductor junctions of the first and the third MOS transistor devices in series; and
a gate of the second MOS transistor device coupled to a gate of the fourth MOS transistor device to connect gate—source semiconductor junctions of the second and the fourth MOS transistor devices in series.

27. The circuit of claim 26, further comprising:
a source of the first MOS transistor device coupled to a source of the fourth MOS transistor device to connect gate—source semiconductor junctions of the first and the fourth MOS transistor devices in series, and
a source of the second MOS transistor device coupled to a source of the third MOS transistor device to connect gate—source semiconductor junctions of the second and the third MOS transistor devices in series.

28. The circuit of claim 27, further comprising:
a drain of the third MOS transistor device coupled to the gate of the third MOS transistor device and the gate of the first MOS transistor device; and
a drain of the fourth MOS transistor device coupled to the gate of the fourth MOS transistor device and the gate of the second MOS transistor device.

29. The circuit of claim 28, further comprising:
a fifth MOS transistor device having a drain coupled to the source of the first MOS transistor device and the source of the fourth MOS transistor device to permit the circuit to be modulated according to an input voltage applied to a gate of the fifth MOS transistor device; and
a bias voltage applied to the source of the second MOS transistor device and the source of the third MOS transistor device to provide a sink for the second control current carried by the second MOS transistor device and for the sum of the first and second control currents carried by the third MOS transistor device.

* * * * *